United States Patent
Park et al.

(10) Patent No.: US 11,217,660 B2
(45) Date of Patent: *Jan. 4, 2022

(54) DIELECTRIC, CAPACITOR INCLUDING DIELECTRIC, SEMICONDUCTOR DEVICE INCLUDING DIELECTRIC, AND METHOD OF MANUFACTURING DIELECTRIC

(71) Applicant: Samsung Electronics Co., Ltd., Suwon-si (KR)

(72) Inventors: Hyeoncheol Park, Hwaseong-si (KR); Chan Kwak, Yongin-si (KR); Euncheol Do, Seoul (KR); Giyoung Jo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/853,195

(22) Filed: Apr. 20, 2020

(65) Prior Publication Data

US 2021/0118980 A1    Apr. 22, 2021

(30) Foreign Application Priority Data

Oct. 21, 2019  (KR) .................. 10-2019-0130812

(51) Int. Cl.
*C04B 35/495* (2006.01)
*H01G 4/12* (2006.01)
(Continued)

(52) U.S. Cl.
CPC ............ *H01L 28/55* (2013.01); *C01G 35/006* (2013.01); *C04B 35/495* (2013.01); *H01G 4/012* (2013.01);
(Continued)

(58) Field of Classification Search
CPC ..... C04B 35/495; C01G 35/006; H01G 4/1254
See application file for complete search history.

(56) References Cited

U.S. PATENT DOCUMENTS

| 4,244,722 | A | 1/1981 | Tsuya et al. |
| 7,095,067 | B2 | 8/2006 | Hwang et al. |
| (Continued) | | | |

FOREIGN PATENT DOCUMENTS

| JP | 2008192867 A | 8/2008 |
| JP | 2018-115093 A | 7/2018 |
| KR | 10-2020-0061879 A | 6/2020 |

OTHER PUBLICATIONS

A. I. Lebedev, "Ferroelectric properties of RbNbO3 and RbTaO3", Physics of the solid state, p. 331-336.
(Continued)

*Primary Examiner* — Karl E Group
(74) *Attorney, Agent, or Firm* — Harness, Dickey & Pierce, P.L.C.

(57) ABSTRACT

Provided are a dielectric including an oxide represented by Formula 1 below and having a cubic crystal structure, a capacitor including the dielectric, a semiconductor device including the dielectric, and a method of manufacturing the dielectric.

$$(Rb_xA_{1-x})(B_yTa_{1-y})O_{3-\delta}$$   <Formula 1>

In Formula 1 above, A is K, Na, Li, Cs, or a combination thereof, B is Nb, V, or a combination thereof, and $0.1 \leq x \leq 0.2$, $0 \leq y \leq 0.2$, and $0 \leq \delta \leq 0.5$ are satisfied.

17 Claims, 8 Drawing Sheets

(51) Int. Cl.
*H01L 49/02* (2006.01)
*H01G 4/30* (2006.01)
*H01G 4/012* (2006.01)
*C01G 35/00* (2006.01)
*H01L 27/108* (2006.01)

(52) U.S. Cl.
CPC .............. *H01G 4/1209* (2013.01); *H01G 4/30* (2013.01); *H01L 27/10835* (2013.01); *H01L 28/91* (2013.01); *C01P 2002/52* (2013.01); *C01P 2002/72* (2013.01); *C01P 2002/76* (2013.01); *C01P 2006/40* (2013.01)

(56) References Cited

U.S. PATENT DOCUMENTS

| | | | |
|---|---|---|---|
| 7,132,373 | B2 | 11/2006 | Fukuhisa et al. |
| 9,449,979 | B2 | 9/2016 | McKinnon et al. |
| 10,032,692 | B2 | 7/2018 | Kalchuri et al. |
| 10,347,817 | B2 * | 7/2019 | Kozuka ............... H01L 41/1873 |
| 2005/0136292 | A1 | 6/2005 | Mariani et al. |
| 2007/0254154 | A1 | 11/2007 | Wong et al. |
| 2010/0129286 | A1 | 5/2010 | Wong et al. |
| 2013/0003254 | A1 | 1/2013 | Koutsaroff et al. |
| 2016/0027579 | A1 | 1/2016 | Kurachi et al. |
| 2020/0165142 | A1 * | 5/2020 | Jung ..................... C01G 33/00 |

OTHER PUBLICATIONS

S. Jones, "Cleaning Trends for Advanced Nodes", https://semiwiki.com/semiconductor-manufacturers/7392-cleaning-trends-for-advanced-nodes/, Apr. 9, 2018, p. 1-8.

Kanghoon Yim et al., "Novel high-k dielectrics for next-generation electronic devices screened by automated ab initio calculations" NPG Asia Materials (2015) 7.

Vishnu Shanker et al., "Nanocrystalline $NaNbO_3$ and $NaTaO_3$: Rietveld studies, Raman spectroscopy and dielectric properties" Solid State Sciences 11 (2009) 562-569.

M. Ahtee and L. Unonius, "The Structure of $NaTaO_3$ by X-ray Powder Diffraction" Acta. Cryst. (1977) A33, 150-154.

Non-Final Office Action dated May 29, 2020 in U.S. Appl. No. 16/409,096.

Notice of Allowance dated Nov. 5, 2020 in U.S. Appl. No. 16/409,096.

* cited by examiner

DIELECTRIC, CAPACITOR INCLUDING DIELECTRIC, SEMICONDUCTOR DEVICE INCLUDING DIELECTRIC, AND METHOD OF MANUFACTURING DIELECTRIC

CROSS-REFERENCE TO RELATED APPLICATION

This application claims the benefit of Korean Patent Application No. 10-2019-0130812, filed on Oct. 21, 2019, in the Korean Intellectual Property Office, the disclosure of which is incorporated herein in its entirety by reference.

BACKGROUND

1. Field

The present disclosure relates to a dielectric, a capacitor including the dielectric, a semiconductor device including the dielectric, and a method of manufacturing a dielectric.

2. Description of Related Art

Recently, the trend toward high functionalization, high efficiency, miniaturization and lightweight electronic devices has progressed rapidly, and accordingly, the miniaturization and high performance of electronic components are progressing rapidly, and the adoption of electronic components requiring high reliability is also increasing.

As electronic components, capacitors and the like are used. Recently, as a dielectric of a capacitor, $SrTiO_3$ having a high dielectric constant (permittivity) is known. However, $SrTiO_3$ has an excellent dielectric constant but has increased current leakage due to a small bandgap, and thus a material having a good dielectric constant and low current leakage may be beneficial.

SUMMARY

Provided are dielectrics having an improved dielectric constant and including oxides having a novel crystal structure.

Provided are capacitors including the dielectrics.

Provided are semiconductor devices including the dielectrics.

Provided are methods of manufacturing the dielectrics.

Additional aspects will be set forth in part in the description which follows and, in part, will be apparent from the description, or may be learned by practice of the presented embodiments of the disclosure.

According to an aspect of an embodiment, a dielectric includes an oxide represented by Formula 1 below and having a cubic crystal structure:

<Formula 1> in Formula 1, A is at least one of K, Na, Li, and Cs, B is at least one of Nb, V, and $0.01 \leq x \leq 0.2$, $0 \leq y \leq 0.2$, and $0 \leq \delta \leq 0.5$ are satisfied.

According to an aspect of another embodiment, a capacitor comprising a first electrode; a second electrode: and the aforementioned dielectric between the first electrode and the second electrode.

According to an aspect of another embodiment, a semiconductor device comprising the aforementioned dielectric.

According to an aspect of another embodiment, a method of manufacturing the dielectric comprising: mixing a Rb precursor, a Ta precursor, and an A precursor to prepare a mixture, the A precursor including at least one of K, Na, Li, and Cs; heat-treating the mixture in a first heat-treating operation, the first heat-treating operation performed in an air or oxygen atmosphere; molding and pressing the first heat-treated product to prepare a molded product; and heat-treating the molded product in a second heat-treating operation.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a dielectric, a capacitor including the dielectric, a semiconductor device including the dielectric, and a method of manufacturing a dielectric according to example embodiments will be described in more detail.

A dielectric according to an embodiment includes an oxide represented by Formula 1 below and having a cubic crystal structure.

<Formula 1>

In Formula 1, A may be potassium (K), sodium (Na), lithium (Li), cesium (Cs) or a combination thereof; B may be niobium (Nb), vanadium (V), or a combination thereof, and $0.01 \leq x \leq 0.2$, $0 \leq y \leq 0.2$, and $0 \leq \delta \leq 0.5$ are satisfied.

$\delta$ represents an oxygen vacancy that makes the oxide of Formula 1 electrically neutral.

The oxide may have a cubic crystal structure at room temperature and normal pressure.

In Formula 1, x may be 0.01 to 0.2, for example 0.025 to 0.15, and y may be 0, 0.01 to 0.2, for example 0.025 to 0.15.

As the degree of integration of semiconductor memory devices are improved, a capacitor having a small size and a high capacitance may be beneficial. In particular, since the high capacitance of a capacitor is proportional to the dielectric constant of a dielectric layer, studies on dielectrics, which comprise materials having high dielectric constants, have been actively conducted.

When RbTaO$_3$ has a cubic crystal structure through simulation density functional theory (DFT) calculation, the dielectric constant of RbTaO$_3$ may increase. However, RbTaO$_3$ may also not be a cubic crystal structure at room temperature and normal pressure. For example, RbTaO$_3$, may have a monoclinic crystal structure at room temperature and normal pressure, and have a low dielectric constant of 30. Here, room temperature refers to 25° C., and normal pressure refers to 1 atm.

The present inventors have solved the above-mentioned problems and completed the present disclosure for a dielectric including an oxide of Formula 1 having a cubic crystal structure at room temperature and normal pressure.

The capacitance of a capacitor using the dielectric is represented by Equation 1 below.

$$C = \varepsilon_r \varepsilon_0 \frac{A}{d} \qquad \langle\text{Equation 1}\rangle$$

In Equation 1, $\varepsilon_0$ is permittivity of vacuum, $\varepsilon_r$ is a dielectric constant, A is an electrode area of a dielectric, and d is a thickness of a dielectric.

The capacitance of a capacitor is proportional to the electrode area of a dielectric and the dielectric constant of a dielectric, and is inversely proportional to the thickness of a dielectric. Thus, it is possible to increase the capacitance of a capacitor by using dielectrics with higher dielectric constants, increasing the electrode area of a capacitor, and/or decreasing the thickness of the dielectric.

Since the dielectric according to an embodiment has excellent dielectric characteristics, a capacitor having increased capacitance may be manufactured when using this dielectric.

The dielectric according to an embodiment has a dielectric constant of 50 or more, 55 or more, 60 or more, 65 or more, 70 or more, 75 or more, 80 or more, 85 or more, 90 or more, 95 or more, 100 or more, 105 or more, 110 or more, 115 or more, 120 or more, or 125 or more, for example, 65 to 125 at 1 MHz. As such, when the dielectric has a high dielectric constant, the capacitance of a capacitor including the dielectric is increased.

The oxide may be represented by Formula 2 below.

<Formula 2>

In Formula 2 above, 0.01≤x≤0.2, 0≤y≤0.2, and 0≤δ≤0.5 are satisfied.

For example, in Formula 2 above, x may be 0.025 to 0.15, y may be 0.025 to 0.15, and δ may be 0.

The oxide may be represented by Formula 3 below.

<Formula 3>

In Formula 3 above, 0.01≤x≤0.2 and 0≤δ≤0.5 are satisfied.

For example, in Formula 3 above, x may be 0.025 to 0.15, and δ may be 0.

The oxide may be, for example, Rb$_x$K$_{1-x}$TaO$_3$ (0.01≤x≤0.2), Rb$_x$Li$_{1-x}$TaO$_3$ (0.01≤x≤0.2), Rb$_x$Na$_{1-x}$TaO$_3$ (0.01≤x≤0.2), Rb$_x$Cs$_{1-x}$TaO$_3$ (0.01≤x≤0.2), Rb$_x$K$_{1-x}$Nb$_y$Ta$_{1-y}$O$_3$ (0.01≤x≤0.2, y=0 or 0.01≤y≤0.2), Rb$_x$Li$_{1-x}$Nb$_y$Ta$_{1-y}$O$_3$ (0.01≤x≤0.2, y=0 or 0.01≤y≤0.2), Rb$_x$Na$_{1-x}$Nb$_y$Ta$_{1-y}$O$_3$ (0.01≤x≤0.2, y=0 or 0.01≤y≤0.2), Rb$_x$Cs$_{1-x}$Nb$_y$Ta$_{1-y}$O$_3$ (0.01≤x≤0.2, y=0 or 0.01≤y≤0.2), Rb$_x$K$_{1-x}$V$_y$Ta$_{1-y}$O$_3$ (0.01≤x≤0.2, y=0 or 0.01≤y≤0.2), Rb$_x$Li$_{1-x}$V$_y$Ta$_{1-y}$O$_3$ (0.01≤x≤0.2, y=0 or 0.01≤y≤0.2), Rb$_x$Na$_{1-x}$V$_y$Ta$_{1-y}$O$_3$ (0.01≤x≤0.2, y=0 or 0.01≤y≤0.2), Rb$_x$Cs$_{1-x}$V$_y$Ta$_{1-y}$O$_3$ (0.01≤x≤0.2, y=0 or 0.01≤y≤0.2), or a combination thereof. For example, in the Formulae above, x may be 0.025 to 0.15, and y may be 0 or 0.025 to 0.15.

The dielectric including the oxide according to an embodiment may have a cubic crystal structure as a main phase, and includes a small amount of K$_6$Ta$_{10.8}$O$_{30}$ or K$_2$Ta$_2$O$_6$ as a minor phase. The content of the minor phase in the dielectric including the oxide may be 10 wt % or less, 9 wt % or less, 5 wt % or less, 3 wt % or less, or 1 wt % or less, based on the sum of the main phase and the minor phase.

The oxide is, for example, (Rb$_{0.15}$K$_{0.85}$)TaO$_3$, (Rb$_{0.1}$K$_{0.9}$)TaO$_3$, (Rb$_{0.09}$K$_{0.91}$)TaO$_3$, (Rb$_{0.08}$K$_{0.92}$)TaO$_3$, (Rb$_{0.07}$K$_{0.93}$)TaO$_3$, (Rb$_{0.06}$K$_{0.94}$)TaO$_3$, (Rb$_{0.07}$K$_{0.93}$)TaO$_3$, (Rb$_{0.08}$K$_{0.92}$)TaO$_3$, (Rb$_{0.09}$K$_{0.91}$)TaO$_3$, (Rb$_{0.05}$K$_{0.95}$)TaO$_3$, (Rb$_{0.025}$K$_{0.075}$)TaO$_3$, Rb$_{0.05}$K$_{0.05}$Nb$_{0.05}$Ta$_{0.0503}$, Rb$_{0.1}$K$_{0.9}$Nb$_{0.1}$Ta$_{0.9}$O$_3$, Rb$_{0.15}$K$_{0.85}$Nb$_{0.15}$Ta$_{0.85}$O$_3$, Rb$_{0.2}$K$_{0.8}$Nb$_{0.2}$Ta$_{0.8}$O$_3$, Rb$_{0.025}$K$_{0.075}$Nb$_{0.025}$Ta$_{0.075}$O$_3$, or a combination thereof.

The oxide of Formula 1 may have a melting point of 1050° C. or higher, for example, 1050° C. to 1350° C. The melting point of the oxide may be measured by differential scanning calorimetry (DSC), and the melting point thereof decreases as the content (x) of Rb in Formula 1 increases. Therefore, considering the melting point of each oxide according to the value of x during the preparation of the oxide, heat treatment conditions such as heat treatment temperature and heat treatment time should be controlled differently.

The oxide included in the dielectric should be made substantially nonporous to achieve a high dielectric constant. For example, the manner in which the oxide included in the dielectric is prepared should be one that reduces or minimizes porosity, thereby obtaining a dielectric having low porosity. When the relative density or nonporosity of the dielectric increases, the dielectric constant thereof may increase. When the relative density or nonporosity of the dielectric substantially increases, in the SEM image of the cross section of the dielectric, voids larger than the thickness of a grain boundary between primary particles may be minimized. The dielectric may have pores.

The relative density of the oxide included in the dielectric, measured by a buoyancy method (e.g., Archimedes method) may be 50% or more, 60% or more, 65% or more, 70% or more, 75% or more, 80% or more, 85% or more, 90% or more, or 95% or more. Since the oxide included in the dielectric has high relative density, the dielectric constant of the oxide increases. The relative density is a percentage value of density of the measured oxide to density of the liquid (e.g., water) used in the buoyancy method.

The relative density of the compound of Formula 2 is, for example, 50 to 72%, and the relative density of the compound of Formula 3 is for example 55 to 70%.

The dielectric loss tan δ of the oxide included in the dielectric may be 0.11 or less, 0.105 or less, 0.10 or less, 0.090 or less, 0.080 or less, 0.070 or less, 0.060 or less, 0.050 or less, 0.040 or less, 0.030 or less, 0.020 or less, or 0.010 or less. Since the oxide included in the dielectric has a low dielectric loss, the dielectric constant of the oxide increases. Current leakage in a capacitor is reduced, and short circuit is prevented.

The maximum dielectric constant ($\varepsilon_m$) of the oxide according to an embodiment is 100 or more, for example 190 or more, 195 or more, 197 or more, and/or 210 or more, for example 100 to 210. The maximum dielectric constant ($\varepsilon_m$) is a dielectric constant under the assumption that the porosity is 0%, and is calculated by Equation 2 below.

$$\varepsilon_m = \frac{\sqrt{4\varepsilon r(2-3P) + (1+3P-2\varepsilon_r)^2} - (1+3P-2\varepsilon_r)}{2(2-3P)} \quad \text{[Equation 2]}$$

In Equation 2, P is porosity, and $\varepsilon_r$ is a dielectric constant.

The bandgap of the oxide of Formula 1 may be 3 eV or more, for example 3.6 eV or more, for example 3.7 eV or more. For example, the bandgap of the oxide of Formula 1 may be 3 eV to 4 eV. When the bandgap of the oxide is too low, the resistivity of the dielectric decreases, thereby reducing the resistance of the capacitor. When the bandgap of the oxide is too large, it is difficult to match an electrode with the dielectric connected to the electrode.

A capacitor according to another embodiment includes a first electrode, a second electrode, and the aforementioned dielectric between the first electrode and the second electrode.

Since the capacitor includes the aforementioned dielectric, the capacitance of the capacitor increases, and the current leakage in the capacitor decreases. The type of the capacitor is not particularly limited. For example, the capacitor may be a capacitor included in a memory cell, a laminated capacitor used in a laminated ceramic condenser, or the like.

The dielectric according to an embodiment is a dielectric having a high dielectric constant applicable to a dynamic random access memory (DRAM) capacitor. This dielectric improves capacitance coupling between neighboring metal and semiconductor.

Figure 1A:
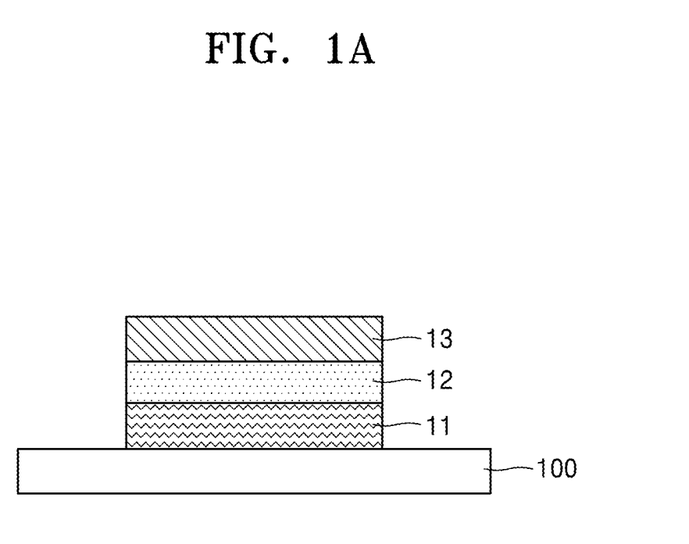
FIGS. 1A to 1D are schematic views of capacitors according to an embodiment.

FIG. 1A illustrates a structure of a capacitor including the aforementioned dielectric. This structure includes an insulating substrate 100, a first electrode 11, a dielectric layer 12, and a second electrode 13. The first electrode 11 functions as a lower electrode, and the second electrode 13 functions as an upper electrode. The first electrode 11 and the second electrode 13 are not electrically connected to each other, and the dielectric layer 12 including the aforementioned dielectric is disposed between the first electrode 11 and the second electrode 13.

Figure 1B:
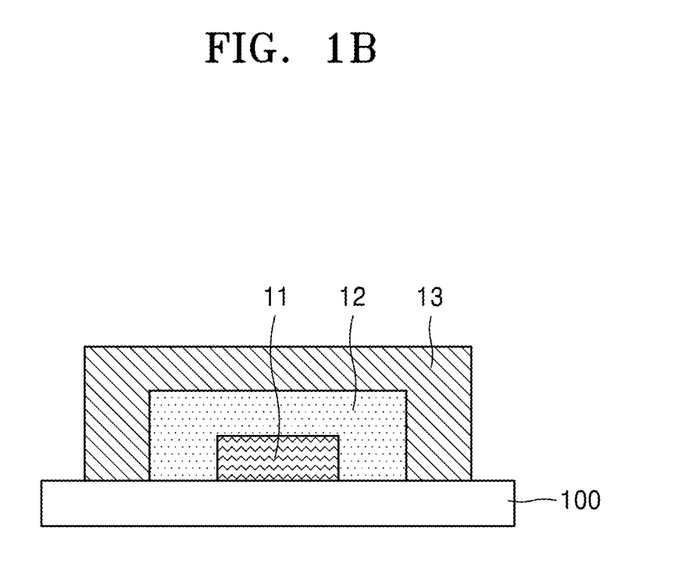
Figure 1C:
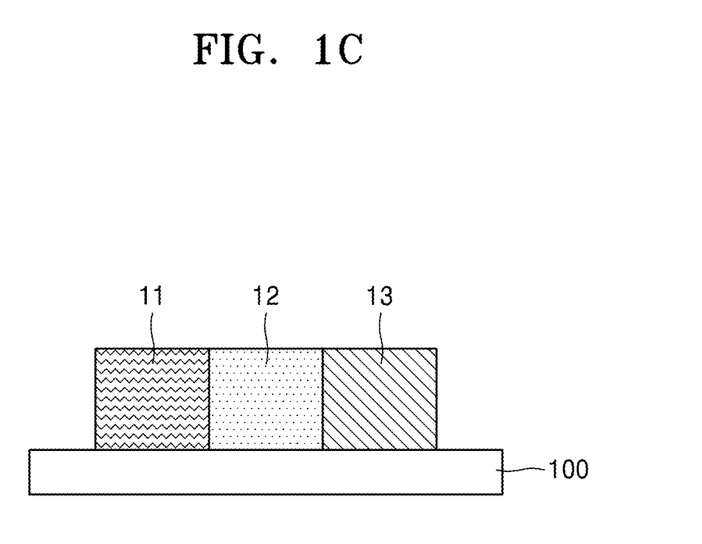
Figure 1D:
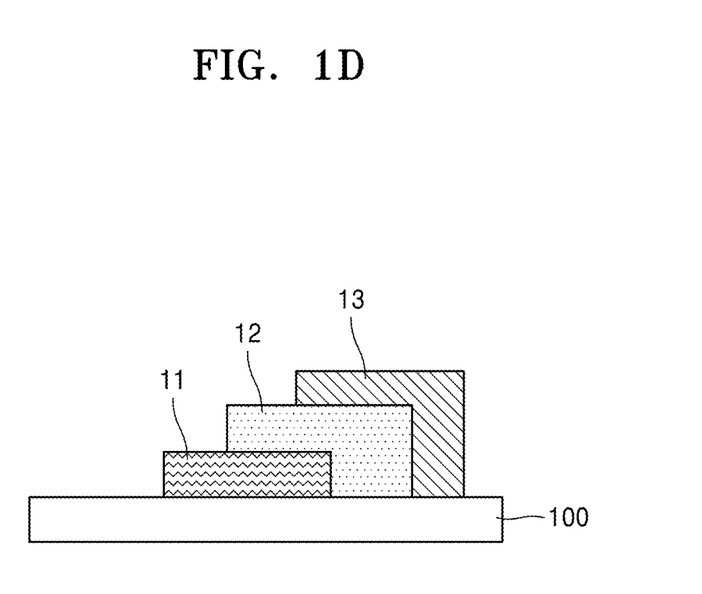

FIGS. 1B to 1D illustrate other structures of the capacitor including a dielectric layer including the aforementioned dielectric.

Referring to FIG. 1B, a dielectric layer 12 covers a first electrode 11 on an insulating substrate 100, and a second electrode 13 covers the dielectric layer 12. Referring to FIG. 1C, a first electrode 11 and a second electrode 13 are on an insulating substrate 100, and a dielectric layer 12 including the dielectric according to an embodiment is disposed between the first electrode 11 and the second electrode 13. Referring to FIG. 1D, a dielectric layer 12 covers a part of a first electrode 11 on the insulating substrate 100, and a second electrode 13 covers a part of the dielectric layer 12. A dielectric layer includes a dielectric to exhibit dielectric characteristics. The dielectric layer 12 may include the dielectric according to an embodiment.

The dielectric layer 12 may be formed using, for example, a chemical vapor deposition process, an organometallic chemical vapor deposition process, a vapor phase epitaxy process, a sol-gel process, a sputtering process, a pulse laser deposition process, an atomic layer deposition process, or the like.

When the dielectric layer 12 is formed using the organometallic chemical vapor deposition process, an insulating substrate 100 on which a surface-treated first electrode 11 is formed is loaded in a reaction chamber, and the reaction chamber is maintained at a temperature of about 500° C. to about 600° C. and a pressure of about 1 Torr t about 10 Torr. Subsequently, an organic metal precursor is provided onto the surface-treated first electrode 11, and then an oxidant is supplied to form the dielectric layer 12 on the surface-treated first electrode 11. When the dielectric layer 12 includes $NaTaO_3$, the organic metal precursor includes sodium or a sodium-containing first precursor compound and a tantalum or a tantalum-containing second precursor compound, and the oxidant includes oxygen ($O_2$), ozone ($O_3$), nitrogen dioxide ($NO_2$) or nitrogen monoxide ($N_2O$).

A heat treatment process for the dielectric layer 12 is performed to enable the materials constituting the dielectric layer 12 to be additionally crystallized. For example, the dielectric layer 12 is heat-treated by a rapid heat treatment process (RTP) under an atmosphere of oxygen gas ($O_2$) gas, nitrogen gas ($N_2$), argon gas (Ar), ammonia gas ($NH_4$), or a mixture thereof. The rapid heat treatment process is performed at a temperature of about 500° C. to about 650° C. for about 30 seconds to about 3 minutes.

The dielectric layer 12 may be formed by heat-treating a coating film obtained by applying and drying dielectric paste including the aforementioned dielectric.

Since the coating method does not use a vacuum process or a high-temperature process, the dielectric layer 12 may be formed simply.

The dielectric paste may include the aforementioned dielectric, an organic component, and a solvent. The dielectric paste includes dielectric particles. The organic component is embedded in the voids between the dielectric particles to prevent the short circuit of a capacitor and improve the production yield of a capacitor.

Examples of the organic component include a monomer, an oligomer, a polymer, a photopolymerization initiator, a plasticizer, a leveling agent, a surfactant, a silane coupling agent, a defoamer, a pigment, and/or a dispersant. In view of improving the bending resistance of a capacitor, for example, the organic component is an oligomer or a polymer. The oligomer or polymer is for example, a thermoplastic resin and a thermosetting resin. Examples of the oligomer or polymer include acrylic resin, epoxy resin, novolak resin, phenol resin, polyimide precursor resin, polyimide resin, polysiloxane resin, fluorine resin, and polyvinyl acetal resin.

Any solvent may be used as long as it disperses the dielectric particles and dissolves the organic component. Examples of the solvent include ketone-based solvents such as methyl ethyl ketone, acetone, diethyl ketone, methyl isobutyl ketone, methyl isopropyl ketone, cyclopentanone, cyclohexanone; alcohol-based solvents such as methanol, ethanol, isopropanol, isobutyl alcohol, benzyl alcohol, methoxymethylbutanol, ethylene glycol, diethylene glycol, glycerin; ether-based solvents such as diethyl ether, diisopropyl ether, 1,2-dimethoxyethane, 1,4-dioxane, tetrahydrofuran, tetrahydropyran, anisole, diethylene glycol dimethyl ether (diglyme), diethylene glycol ethyl ether (carbitol); cellosolve-based solvents such as methyl cellosolve, ethyl cellosolve, and phenyl cellosolve; aliphatic hydrocarbon-based solvents such as hexane, pentane, heptane, and cyclohexane; aromatic hydrocarbon-based solvents such as toluene, xylene, and benzene; aromatic heterocyclic compound solvents such as pyridine, pyrazine, furan, pyrrole, thiophene, and N-methylpyrrolidone; amide-based N,N-dimethylformamide and N,N-dimethylacetamide; halogen compound-based solvents such as trichloroethylene, dichloromethane, chloroform, 1,2-dichloroethane, and chlorobenzene; ester-based solvents such as ethyl acetate, methyl acetate, ethyl formate, ethyl lactate, dimethyl carbonate, diethyl carbonate, propylene carbonate, and γ-butyrolactone; sulfur compound-based solvents such as dimethyl sulfoxide and sulfolane; nitrile-based solvents such as acetonitrile, propionitrile, and acrylonitrile; organic acid-based solvents such as formic acid, acetic acid, trichloroacetic acid, and trifluoroacetic acid; and mixed solvents thereof.

Examples of the coating method include spin coating, blade coating, slit die coating, screen printing, bar coating, casting, gravure printing, flexographic printing, offset printing, dip coating, inkjet printing, and dispensing. Among these coating methods, in terms of pattern workability and film formability, for example, screen printing, gravure printing, flexographic printing, offset printing, inkjet printing, and dispensing are used.

The method of removing a solvent from a coating film is, for example, heat drying or vacuum drying using an oven, a hot plate, or infrared light, and may be performed at a temperature of about 50° C. to about 140° C. for about 1 minute to about several hours.

Next, in order to improve dielectric characteristics, the coating film is cured. The curing temperature is selected depending on the kind of dielectric compound, the solvent used, and the kind of substrate. For example, when the organic component in the dielectric paste is an acrylic resin, from the viewpoint of heat resistance, the curing temperature is in a range of about 50° C. to about 300° C. Further, when the insulating substrate is polyethylene terephthalate, from the viewpoint of preventing the deterioration in processing accuracy due to thermal expansion of the substrate, the curing temperature may be in a range of about 50° C. to about 150° C. As the curing method, heat curing or vacuum curing using an oven, a hot plate or infrared light, curing using a xenon flash lamp, and photocuring using UV light may be used.

In order to increase the flatness of the dielectric layer, it is possible to form a planarization layer on the coating film obtained by coating and drying the dielectric paste. The material of the planarization layer may be a known resin such as a polyimide resin, a polysiloxane resin, an acrylic resin, or an epoxy resin. From the viewpoint of dielectric characteristics, for example, the thickness of the planarization layer may be less than the thickness of the dielectric layer.

The dielectric layer may be patterned or not patterned. From the view point of preventing the misreading y reducing crosstalk between dielectric elements, the dielectric layer may be patterned. As the patterning method, for example, from the viewpoint of fine processing, photolithography processing in which the organic component is a photosensitive organic component is used. When the photolithography processing is used, the high integration of the dielectric elements may be realized.

Each of the first electrode 11 and the second electrode 13 includes, but is not limited to, at least one of strontium-ruthenium oxide ($SrRuO_3$), Iridium-ruthenium oxide ($SrIrO_3$), calcium-ruthenium oxide ($CaRuO_3$), calcium-nickel oxide ($CaNiO_3$), barium-ruthenium oxide ($BaRuO_3$), barium-strontium-ruthenium oxide (($Ba,Sr)RuO_3$), iridium (Ir), iridium-ruthenium alloy (IrRu), iridium oxide ($IrO_2$), titanium-aluminum nitride (TiAlN), titanium oxide ($TiO_2$), ruthenium (Ru), platinum (Pt), zirconium oxide ($ZrO_2$), tin oxide ($SnO_2$), and indium-tin oxide (ITO). These materials may be used alone or in combination with each other.

Each of the first electrode 11 and the second electrode 13 may be formed by depositing a metal, a metal oxide, a metal nitride, a metal oxynitride, or a metal alloy through an electron-beam deposition process, a chemical vapor deposition process, a sputtering process, an atomic layer deposition process, or a pulsed laser deposition process. Each of the first electrode 11 and the second electrode 13 has a single-layer structure or a multi-layer structure.

Differently, each of the first electrode 11 and the second electrode 13 is formed by heat-treating the coating film obtained by applying and drying electrode paste including a conductive material.

Since the coating method does not use a vacuum process or a high-temperature process, it is possible to simply manufacture the first electrode 11 and the second electrode 13.

The electrode paste may include conductive material particles, an organic component, and/or a solvent.

In general, any conductive material may be used as long as it may be used to make an electrode. Examples of the conductive material include conductive metal oxides such as tin oxide, indium oxide, and indium-tin oxide (ITO); metals or alloys thereof such as platinum, gold, silver, copper, iron, tin, zinc, aluminum, indium, chromium, lithium, sodium, potassium, cesium, calcium, magnesium, palladium, molybdenum, amorphous Silicon, and polysilicon; inorganic conductive materials such as copper iodide and copper sulfide; complexes such as polythiophene, polypyrrole, polyaniline, polyethylenedioxythiophene, and polystyrenesulfonic acid; and carbon materials such as conductive polymers. The conductive material's conductivity being improved by doping; for example the carbon materials may be doped with iodine. Although these conductive materials may be used independently, it is possible to use a plurality of materials by laminating or mixing these materials.

The conductive material may be metal particles. By using metal particles, the capacitor may have improved resistance to failure from the bending and/or a coercive electric field may not increase even when voltages are repeatedly applied. Metal particles may also improve the adhesion between the electrode and the dielectric monolayer thin film, due to an anchor effect caused by the formation of an uneven surface of the conductive film and the arrangement of a dielectric monolayer thin film on the unevenness of the conductive film. The metal particles may include at least one selected from gold, silver, copper, platinum, lead, tin, nickel, aluminum, tungsten, molybdenum, ruthenium oxide, chromium, titanium, carbon, and indium.

The organic component and solvent used in the electrode paste may be the same as those used in the dielectric layer.

A semiconductor device may include the aforementioned dielectric according to another embodiment. The semiconductor device may be a memory device.

The dielectric according to an embodiment may be applied to a DRAM, a central processing unit (CPU), a flash memory, and the like.

A method of manufacturing the dielectric according to another embodiment may include: mixing a rubidium (Rb) precursor, a tantalum (Ta) precursor, and an A precursor to prepare a mixture; first heat-treating the mixture in an air or oxygen atmosphere; molding and pressing the first heat-treated product to prepare a molded product; and second heat-treating the molded product. The first heat treatment may be carried out at about 500° C. to about 800° C., for example, about 600° C. to about 700° C., and the second heat treatment is carried out at about 1000° C. to about 1400° C., for example, about 1100° C. to about 1350° C.

A B precursor may also be added to the mixture. The B precursor may include Nb, V, or a combination thereof.

The A precursor may be a sulfate or oxide containing K, Na, Li, Cs, or a combination thereof, and examples thereof include $Na_2CO_3$ and $K_2CO_3$. The B precursor may be a carbonate, sulfate, or oxide containing Nb, V, or a combination thereof, and examples thereof include $Nb_2CO_3$, $Nb_2O_3$, and $V_2O_5$. The Ta precursor may be a carbonate, oxide, or sulfate containing Ta, and an example thereof includes $Ta_2O_5$. The Rb precursor may be an carbonate, oxide, or sulfate containing Rb, and examples thereof include $Rb_2O_3$ and $Rb_2CO_3$.

The dielectric obtained by the aforementioned manufacturing method may provide improved dielectric constant and relative density.

The mixing of the Rb precursor, the Ta precursor, and the A precursor may be carried out by ball milling, planetary ball milling, or high-energy ball milling. However, the mixing thereof is not limited to these methods, and any mixing method may be used as long as it is used in the art. Mixing time may be about 1 hour to about 100 hours.

The first heat treatment may be carried out at about 500° C. to about 800° C., for example, about 600° C. to about 700° C. The first heat treatment may be performed for about 1 hour to about 20 hours, about 4 hours to about 18 hours, about 8 hours to about 16 hours, or about 10 hours to about 14 hours. The first heat treatment may be performed under these conditions to obtain a single phase of an oxide having a cubic crystal structure. The first heat treatment atmosphere may be performed in an air or oxygen atmosphere.

The molding method and the pressing method are not particularly limited, any molding method and any pressing method may be used as long as they are used in the art. The pressing method may be, for example, isostatic pressure, flat pressing, or roll pressing. The applied pressure may be about 100 MPa to about 500 MPa, for example about 150 MPa to about 450 MPa, about 200 MPa to about 400 MPa, about 200 MPa to about 350 MPa, or about 200 MPa to about 300 MPa. The pressing time may be about 1 minute to about 30 minutes, about 1 minute to about 20 minutes, about 1 minute to about 10 minutes, or about 1 minute to about 5 minutes.

The second heat treatment may be carried out at about 1000° C. to about 1400° C., for example, for example about 1100° C. to about 1350° C. The second heat treatment may also be carried out at 1400° C. or higher. When the second heat treatment temperature is within the former range, the dielectric may have a high dielectric constant of 50 or more without lowering the relative density of the dielectric. The second heat treatment may be performed for about 1 hour to about 20 hours, about 1.5 hours to about 18 hours, about 2 hours to about 16 hours, about 2.5 hours to about 12 hours, or about 3 hours to about 10 hours. The dielectric constant of the second heat treatment product obtained by the second heat treatment under these conditions may be increased. The second heat treatment atmosphere may be an air or oxygen atmosphere.

Figure 2:
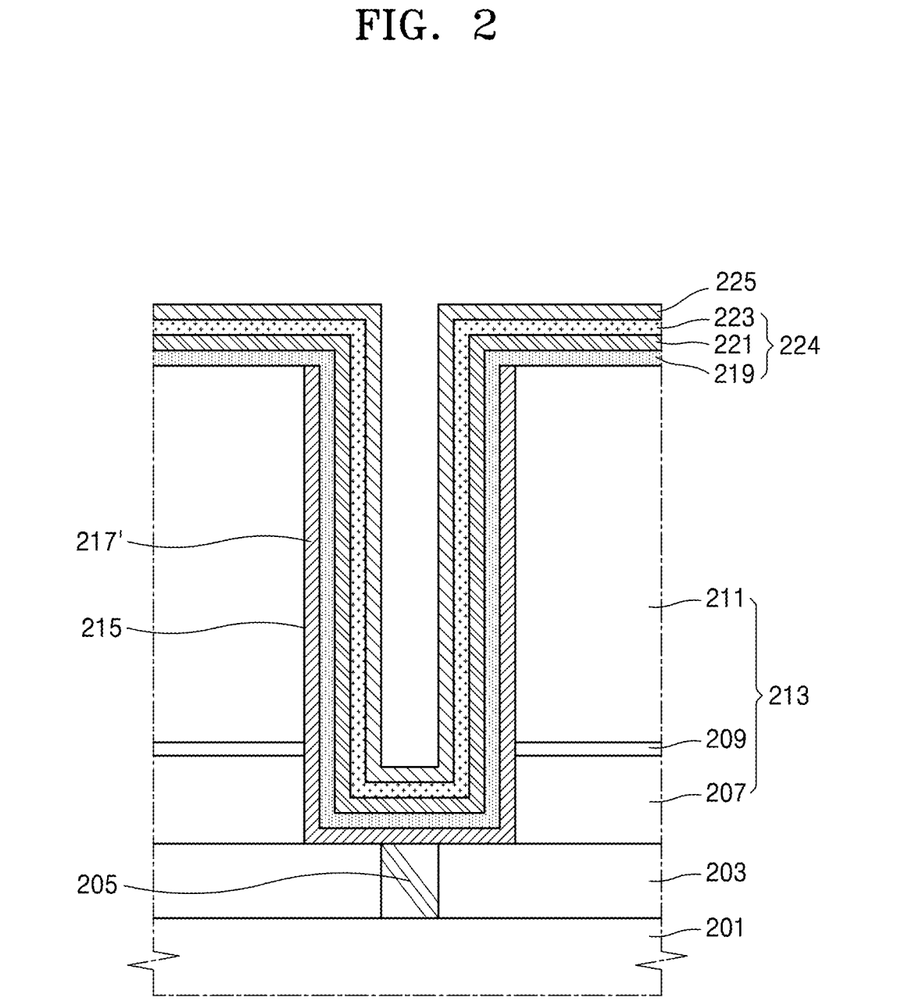
FIG. 2 is a cross-sectional view illustrating a structure of a metal-insulator-metal capacitor (MIM capacitor) according to an embodiment.

FIG. 2 illustrates a structure of an MIM capacitor according to another embodiment.

Referring to FIG. 2, an interlayer insulating film 203 may be laminated on a semiconductor substrate 201, and a contact plug 205 may be formed to fill a contact hole through which the semiconductor substrate 201 may be exposed. A mold insulating film 213 may be formed on the interlayer insulating film 203 having the contact plug 205. As shown in FIG. 2, the mold insulating film 213 may have a structure in which a lower mold insulating film 207, an etch inhibiting film 209, and an upper mold insulating film 211 are sequentially stacked on the semiconductor substrate having the contact plug 205. However, the example embodiments are not so limited, for example, the etch inhibiting film 209 may be formed directly on the upper surfaces of the contact plug 205 and the interlayer insulating film 203. In other embodiments, the mold insulating film 213 may be formed of a double-layered mold insulating film of the lower mold insulating film 207 and the upper mold insulating film 211, or may be formed of a single-layered mold insulating film. The lower mold insulating film 207 and the upper mold insulating film 211 may have etch selectivity with respect to the etch inhibiting film 209. For example, when the lower mold insulating film 207 and the upper mold insulating film 211 are formed as silicon oxide films, the etch inhibiting film 209 may be formed as a silicon nitride film. The mold insulating film 213 may be patterned to form a storage node hole 215 exposing the upper surface of the contact plug 205 and the upper surface of the interlayer insulating film 203 adjacent to the contact plug 205 may be formed by patterning the mold insulating film 213.

A conductive film may be formed on the entire surface of the semiconductor substrate having the storage node hole 215. The conductive film may be formed as a conductive film having excellent step coverage, resistance to deformation during a subsequent process of forming a dielectric film, and having an oxidation resistant property. For example, the lower electrode conductive film may be formed as at least one metal nitride film selected from a titanium nitride film (TiN), a titanium silicon nitride film (TiSiN), a titanium aluminum nitride film (TiAlN), a tantalum nitride film (TaN), a tantalum silicon nitride film (TaSiN), a tantalum aluminum nitride film (TaAlN), and a tungsten nitride film (WN). The conductive film may be etched to be isolated in the storage node hole 150, forming a lower electrode 217'

A buffer insulating film (not illustrated) may be formed on the lower electrode conductive film(not illustrated), and a lower electrode 217' isolated in the storage node hole 215, and the buffer insulating film pattern isolated in the storage node hole 215 are formed. The buffer insulating film pattern may be selectively removed to have a structure exposing the inner wall of the lower electrode 217' A dielectric film 224 in which a lower dielectric film 219 and an upper dielectric film 223 are sequentially laminated is formed over the entire surface of the semiconductor substrate 201 having the lower electrode 217'. The lower dielectric film 219 and the upper dielectric film 223 may include the dielectric according to an embodiment. More specifically, the upper dielectric film 223 may be formed as a high dielectric film having a higher dielectric constant than the lower dielectric film 219. In addition, the lower dielectric film 219 may be formed as a dielectric film having a larger energy band gap than the upper dielectric film 223.

An upper electrode 225 may be formed on the upper dielectric film 223, and the upper electrode 225 may be formed of a metal film having a work function greater than that of the lower electrode 217'.

The upper electrode 225 may comprise at least one noble metal (e.g., a Ru film, a Pt film, and an Ir film) a $Ta_2O_5$ film, a $TiO_2$ film, a doped $TiO_2$ film, and/or an STO film, and the lower dielectric film 219 may comprise at least one of an $HfO_2$ film, a $ZrO_2$ film, an $Al_2O_3$ film, and/or a $La_2O_3$ film.

An intermediate dielectric film 221 may be interposed between the lower dielectric film 219 and the upper dielectric film 223. The lower dielectric film 219 and the upper dielectric film 223 may be formed as crystalline or amorphous dielectric films, and the intermediate dielectric film 221 may be formed as a crystalline or amorphous dielectric film. The lower dielectric film 219 may comprise at least one of an $HfO_2$ film, a $ZrO_2$ film, an $Al_2O_3$ film, and/or a $La_2O_3$ film, each having a crystalline or amorphous structure, and the intermediate dielectric film 221 may include the dielectric according to an embodiment.

According to another example, the intermediate dielectric film 221 may be formed of at least one film selected from an $HfO_2$ film, a $ZrO_2$ film, an $Al_2O_3$ film, a $La_2O_3$ film, a $Ta_2O_5$ film, a doped TiO film, and a STO film, each having a crystalline or amorphous structure. Further, the intermediate dielectric film 221 may be formed of at least one of a $Ta_2O_5$ film, a TiO film, a doped TiO film, and/or a STO film, each having a crystalline or amorphous structure. As described above, the intermediate dielectric film 221 may be formed as a dielectric film having a crystalline or amorphous structure, thereby the breakdown voltage characteristics of the dielectric film 224 may be improved. For example, when the lower dielectric film 219 and the upper dielectric film 223 are formed as a dielectric films each having a crystalline structure, breakdown voltages of the lower dielectric film 219 and the upper dielectric film 223 may be improved, but the leakage current characteristics may be deteriorated. Accordingly, the intermediate dielectric film 221, which may be a dielectric film having an amorphous structure, may be formed between the lower dielectric film 219 and the upper dielectric film 223, thereby providing a capacitor having excellent electrical characteristics such as leakage current characteristics and breakdown voltage characteristics.

The MIM capacitor shown in FIG. 2 may have a concave structure or a cylinder structure.

Figure 3:
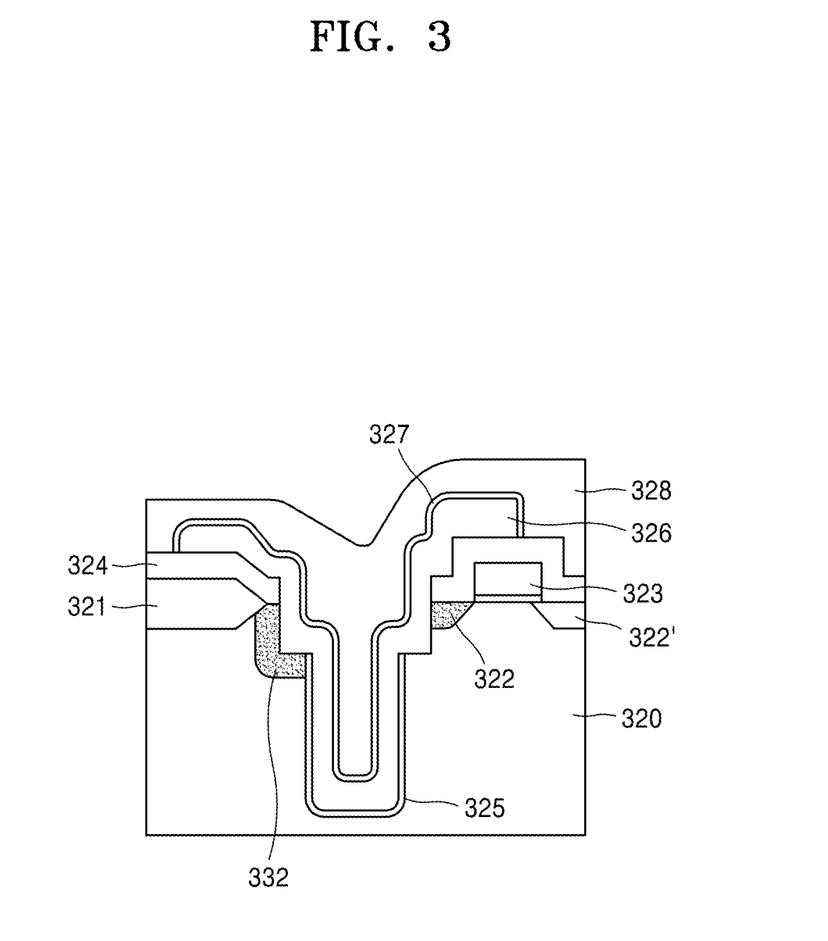
FIG. 3 is a cross-sectional view illustrating a structure of a trench capacitor-type dynamic random access memory (DRAM) according to an embodiment

FIG. 3 illustrates a structure of a trench capacitor type dynamic random access memory (trench capacitor type DRAM).

Referring to FIG. 3, the DRAM illustrates an example embodiment of a trench capacitor type DRAM, but the embodiments are not limited thereto, for example, the DRAM could comprise other an element separation region is formed on a P-type semiconductor substrate 320 by a field oxide film 321. A gate electrode 323 and source/drain impurity regions 322 and 322' are formed in the element separation region. A high-temperature oxide (HTO) film is formed as an interlayer insulating film 324. A trench buffer layer, which is a portion where a trench is not to be formed, is capped, and then a part of the source region 322 is opened to form a contact portion.

A trench is formed on the sidewall of the interlayer insulating film 324, and a sidewall oxide film 325 is formed on the entire sidewall of the trench. The sidewall oxide film 325 compensates for damage in the semiconductor substrate 320 during etching for forming a trench, and also serves as a dielectric film between the semiconductor substrate 320 and a storage electrode 326 to be formed later. The entire sidewall of the source region 322 except for the gate electrode 323 of the source region formed on the trench sidewall may be exposed.

A PN junction (not illustrated) is formed in the side wall portion of the source region by injecting impurities. The trench may be formed in the source region 322, the gate side of the sidewall of the trench may directly contact with the source region 322, and impurities may be additionally injected into the source region to form the PN junction.

A storage electrode 326 may be formed on a part of the interlayer insulating film 324, the exposed source region, and the surface of the sidewall oxide film 325 in the trench. The storage electrode 326 may be, for example, a polysilicon layer, and may be formed so as to contact with the source region 322 toward the gate electrode and the entire source region 322 contacting the upper sidewall of the trench. Further, the source region formed around the upper side wall of the trench is enlarged due to the injected impurities, and thus the source region is more clearly in contact with the storage electrode 326. Then, an insulating film 327 is formed as a dielectric film of a capacitor along the upper surface of the storage electrode 326, and a polysilicon layer, as a plate electrode 328, is formed on the insulating film 327, thereby completing a trench capacitor type DRAM.

The polysilicon layer, as the plate electrode 328, may be formed on a part of the interlayer insulating film 324, the exposed source region 322, and the surface of the sidewall oxide film 325 in the trench. Since the storage electrode 326 is formed to not only be in contact with the source region 322 toward the gate electrode 323, but also in contact with the entire source region contacting the circumference of the upper wall of the trench, the contact area thereof is enlarged, so that the storage electrode 326 is more clearly in contact with the source region and the capacitance of the capacitor increases. The DRAM illustrated in FIG. 3 depicts an example embodiment of a trench capacitor type DRAM, but the embodiments are not limited thereto, for example, the DRAM could comprise other capacitor-type DRAM.

Hereinafter, the present disclosure will be described in more detail with reference the following examples and comparative examples. However, these examples are set forth to illustrate the present disclosure, and the scope of the present disclosure is not limited thereto.

(Manufacture of Dielectric)

EXAMPLE 1

$K_2CO_3$, $RbO_3$, and $Ta_2O_5$ were mixed to obtain a precursor mixture, ethanol and zirconia balls were added to the precursor mixture, and then ball milling was carried out at room temperature (25° C.) under an air atmosphere to obtain a mixture. The contents of $K_2CO_3$, $RbO_3$, and $Ta_2O_5$ were stoichiometrically controlled to obtain $Rb_{0.025}K_{0.075}TaO_3$. The mixture was dried to obtain dry powder.

The dry powder was introduced into an alumina crucible and subjected to first heat treatment at 700° C. under an air atmosphere for 1 hour to remove $CO_2$ and secure a single phase. The product obtained by the first heat treatment was pulverized to prepare a fine powder.

The fine powder was molded into pellets, and then subjected to cold isostatic pressing at a pressure of about 200 MPa for 3 minutes to prepare a press-molded product.

The prepared press-molded product was subjected to second heat treatment at 1330° C. for 1 hour under an air atmosphere to obtain a dielectric comprising $Rb_{0.025}K_{0.075}TaO_3$.

EXAMPLES 2 TO 5 AND COMPARATIVE
EXAMPLES 1 AND 2

Examples 2 to 5 and Comparative Examples 1 and 2 were carried out in the same manner as in Example 1, except that the contents of $K_2CO_3$, $RbO_3$, and $Ta_2O_5$ were stoichiometrically controlled to obtain dielectrics having the compositions of Table 1 below, respectively, and second heat treatment temperature was changed as shown in Table 1 below.

EXAMPLES 6 TO 9

Examples 6 to 9 were carried out in the same manner as in Example 1, except that $Nb_2O_3$ was further added during preparing the precursor mixture, the contents of $K_2CO_3$, $RbO_3$, and $Ta_2O_5$ were stoichiometrically controlled to obtain dielectrics having the compositions of Table 1 below, respectively, and second heat treatment temperature was changed as shown in Table 1 below.

COMPARATIVE EXAMPLE 3

Comparative Example 3 was carried out in the same manner as in Example 1, except that $Rb_2CO_3$ and $Ta_2O_5$ were used during preparing the precursor mixture, and second heat treatment temperature was changed as shown in Table 1 below.

COMPARATIVE EXAMPLE 4

Comparative Example 4 was carried out in the same manner as in Example 1, except that $K_2CO_3$ and $Ta_2O_5$ were used during preparing the precursor mixture, and second heat treatment temperature was changed as shown in Table 1 below.

TABLE 1

| Class. | Dielectric | Second heat treatment temperature (° C.) |
|---|---|---|
| Example 1 | $Rb_{0.025}K_{0.075}TaO_3$ | 1330 |
| Example 2 | $Rb_{0.05}K_{0.05}TaO_3$ | 1320 |
| Example 3 | $Rb_{0.1}K_{0.9}TaO_3$ | 1310 |
| Example 4 | $Rb_{0.15}K_{0.85}TaO_3$ | 1270 |
| Example 5 | $Rb_{0.2}K_{0.8}TaO_3$ | 1260 |
| Example 6 | $Rb_{0.05}K_{0.05}Nb_{0.05}Ta_{0.05}O_3$ | 1320 |
| Example 7 | $Rb_{0.1}K_{0.9}Nb_{0.1}Ta_{0.9}O_3$ | 1300 |
| Example 8 | $Rb_{0.15}K_{0.85}Nb_{0.15}Ta_{0.85}O_3$ | 1250 |
| Example 9 | $Rb_{0.2}K_{0.8}Nb_{0.2}Ta_{0.8}O_3$ | 1200 |
| Comparative Example 1 | $Rb_{0.6}K_{0.4}TaO_3$ | 1050 |
| Comparative Example 2 | $Rb_{0.4}K_{0.6}TaO_3$ | 1100 |
| Comparative Example 3 | $RbTaO_3$ | 1000 |
| Comparative Example 4 | $KTaO_3$ | 1350 |

EVALUATION EXAMPLE 1

XRD Analysis

X-ray diffraction (XRD) analyses of dielectrics of Examples 1 to 5 and Comparative Examples 1, 2, and 4 were carried out. Cu Kα radiation was used to measure XRD spectra. D8 Advance of Bruker Co., Ltd was used in the XRD analyses.

Results of XRD analyses are shown in FIGS. 1A and 1B.

Figure 4A:
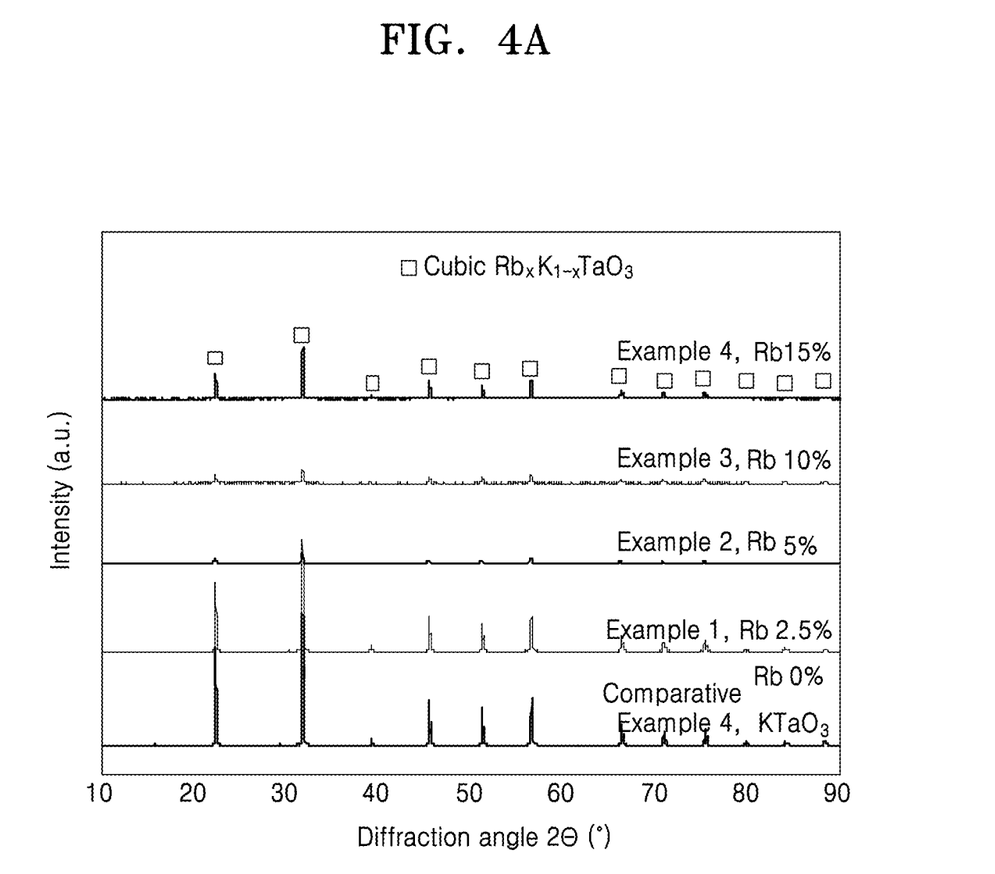
FIG. 4A shows X-Ray Diffraction (XRD) spectra of dielectrics of Examples 1 to 4 and Comparative Example 4.
Figure 4B:
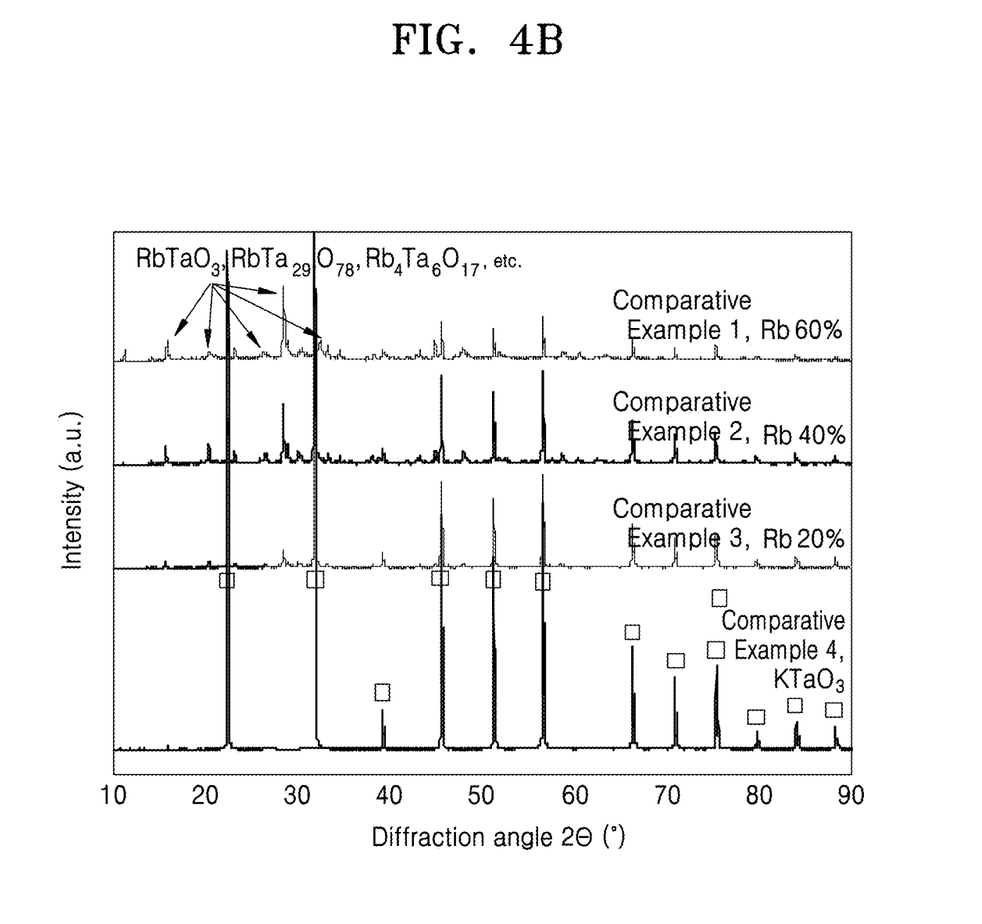
FIG. 4B shows X-Ray Diffraction (XRD) spectra of dielectrics of Example 5, Comparative Example 1, Comparative Example 2, and Comparative Example 4.
Figure 5:
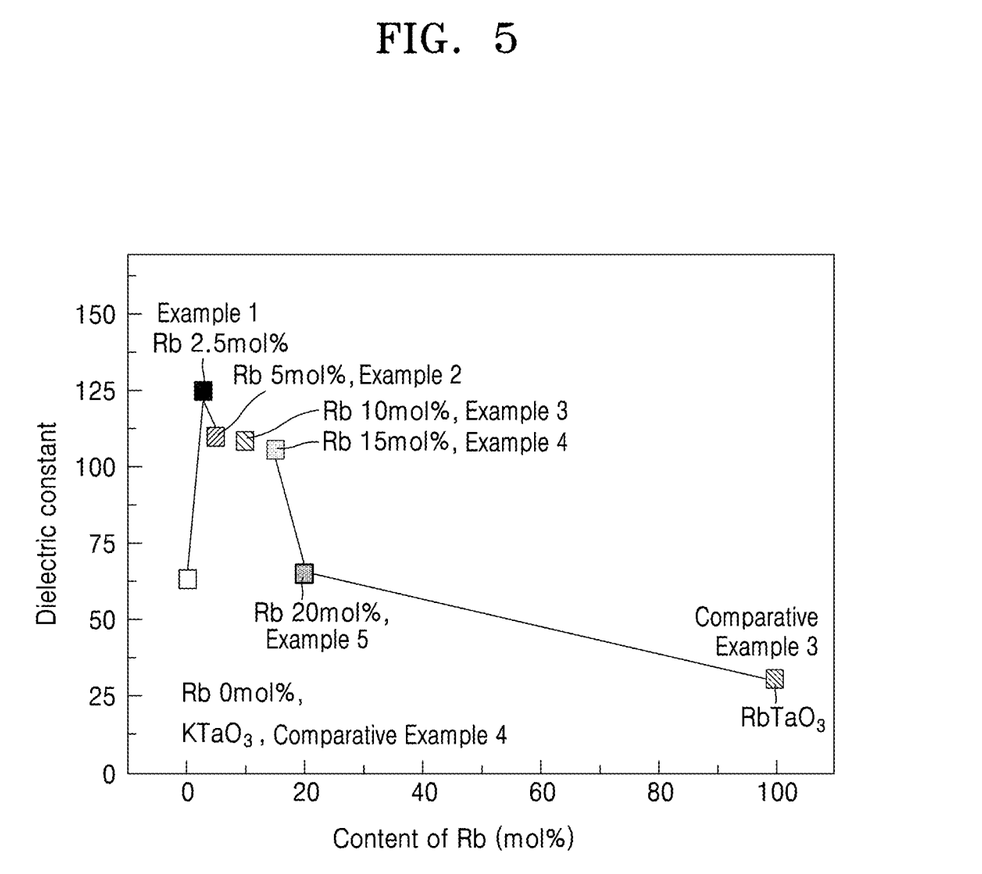
FIG. 5 is a graph illustrating dielectric constants of dielectrics of Examples 1 to 5, Comparative Example 3, and Comparative Example 4.
Figure 6:
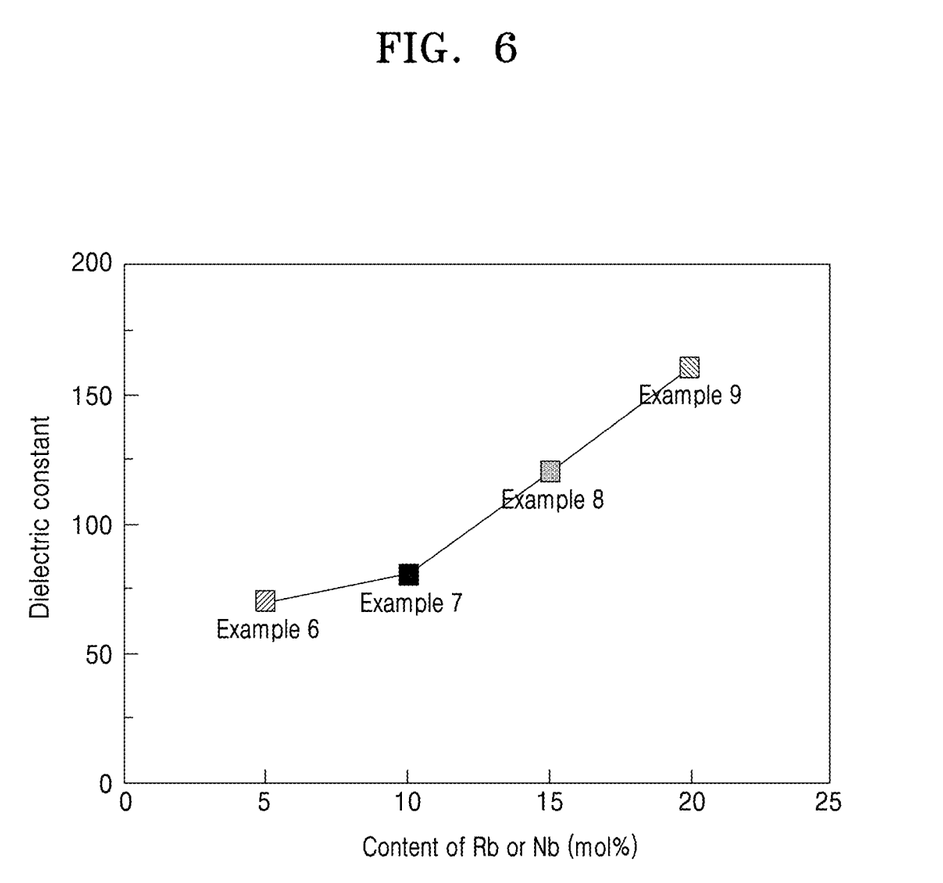
FIG. 6 is a graph illustrating dielectric constants of dielectrics of Examples 6 to 9.

As shown in FIGS. 4A and 4B, it may be found that each of the dielectrics of Examples 1 to 5 has a cubic crystal structure at room temperature and atmospheric pressure.

Further, it may be found that the dielectric of Example 5 contains a very small amount of $RbTaO_3$ having a monoclinic crystal structure.

In contrast, it may be found that the dielectric of Comparative Example 3 has a monoclinic crystal structure, the dielectric of Comparative Example 4 has a cubic crystal structure, and each of the dielectrics of Comparative Examples 1 and 2 has a composite phase of monoclinic $RbTaO_3$ as a major phase.

XRD analyses of dielectrics of Examples 6 to 9 were carried out. As results of XRD analyses, it may be found that each of the dielectrics of Examples 6 to 9 has a cubic crystal structure at room temperature and atmospheric pressure, similarly to the dielectric of Example 1.

EVALUATION EXAMPLE 2

Evaluation of Relative Density

Relative densities of the dielectrics prepared in Examples 1 to 9 and Comparative Examples 1 to 4 were measured using a buoyancy method. The measurement results of the relative densities are given in Table 2 below.

TABLE 2

| Class. | Dielectric | Relative density (%) |
|---|---|---|
| Example 1 | $Rb_{0.025}K_{0.075}TaO_3$ | 73 |
| Example 2 | $Rb_{0.05}K_{0.05}TaO_3$ | 70 |
| Example 3 | $Rb_{0.1}K_{0.9}TaO_3$ | 70 |
| Example 4 | $Rb_{0.15}K_{0.85}TaO_3$ | 68 |
| Example 5 | $Rb_{0.2}K_{0.8}TaO_3$ | 55 |
| Example 6 | $Rb_{0.05}K_{0.05}Nb_{0.05}Ta_{0.05}O_3$ | 50 |
| Example 7 | $Rb_{0.1}K_{0.9}Nb_{0.1}Ta_{0.9}O_3$ | 55 |
| Example 8 | $Rb_{0.15}K_{0.85}Nb_{0.15}Ta_{0.85}O_3$ | 64 |
| Example 9 | $Rb_{0.2}K_{0.8}Nb_{0.2}Ta_{0.8}O_3$ | 72 |
| Comparative Example 1 | $Rb_{0.6}K_{0.4}TaO_3$ | 60 |
| Comparative Example 2 | $Rb_{0.4}K_{0.6}TaO_3$ | 55 |
| Comparative Example 3 | $RbTaO_3$ | 55 |
| Comparative Example 4 | $KTaO_3$ | 55 |

As given in Table 2 below, dielectrics of Examples 1 to 9 tended to have equal relative density to or higher relative density than those of Comparative Examples 3 and 4.

EVALUATION EXAMPLE 3

Dielectric Constant

Both surfaces of dielectric pellets prepared in Examples 1 to 9 and Comparative Examples 1 to 4 were coated with In-Ga to form electrodes, and dielectric constants thereof in a frequency range of 1 kHz to 1 MHz at room temperature (25° C.) were measured using an E4980A Precision LCR Meter (Keysight).

The measurement results of dielectric constants at 1 MHz are given in Table 3 below. The relative densities thereof are also given in Table 3 below.

TABLE 3

| Class. | Dielectric | Dielectric constant | Maximum dielectric constant (porosity 0%) | Relative density (%) |
|---|---|---|---|---|
| Example 1 | $Rb_{0.025}K_{0.075}TaO_3$ | 125 | 210 | 73 |
| Example 2 | $Rb_{0.15}K_{0.05}TaO_3$ | 110 | 197 | 70 |
| Example 3 | $Rb_{0.1}K_{0.9}TaO_3$ | 108 | 195 | 70 |
| Example 4 | $Rb_{0.15}K_{0.85}TaO_3$ | 105 | 201 | 68 |
| Example 5 | $Rb_{0.2}K_{0.8}TaO_3$ | 65 | 197 | 55 |
| Example 6 | $Rb_{0.05}K_{0.05}Nb_{0.05}Ta_{0.05}O_3$ | 80 | 243 | 55 |
| Example 7 | $Rb_{0.1}K_{0.9}Nb_{0.1}Ta_{0.9}O_3$ | 133 | 235 | 71 |
| Example 8 | $Rb_{0.15}K_{0.85}Nb_{0.15}Ta_{0.85}O_3$ | 185 | 275 | 78 |
| Example 9 | $Rb_{0.2}K_{0.8}Nb_{0.2}Ta_{0.8}O_3$ | 155 | 270 | 72 |
| Comparative Example 1 | $Rb_{0.6}K_{0.4}TaO_3$ | 35 | 92 | 60 |
| Comparative Example 2 | $Rb_{0.4}K_{0.6}TaO_3$ | 40 | 90 | 55 |
| Comparative Example 3 | $RbTaO_3$ | 30 | 89 | 55 |
| Comparative Example 4 | $KTaO_3$ | 63 | 190 | 55 |

As given in Table 3, the dielectrics of Examples 1 to 9 each having a cubic crystal structure exhibit a high dielectric constant of 65 or more and a maximum dielectric constant of 195 or more. In contrast, the dielectrics of Comparative Examples 3 and 4 exhibit a dielectric constant of less than 63 and a maximum dielectric constant of less than 190.

EVALUATION EXAMPLE 5

Evaluation of Bandgap

After measuring the UV-Vis absorption spectra for the dielectrics prepared in Examples 1 to 4, 6, 9 and Reference Example 1, the UV-Vis absorption spectra were converted into a graph for $(\alpha h\nu)^2$ and $h\nu$ using Equation $\alpha h\nu = A(h\nu Eg)^{1/2}$, and the results thereof are shown in FIG. 3. In the graph obtained by converting the UV-Vis absorption spectra, a bandgap was obtained by extrapolating a slope. In the Equation, A is absorbance, $\alpha$ is an absorption coefficient, $h\nu$ is photon energy, and Eg is a bandgap. The bandgap was measured using a UV visible spectrophotometer (Hitachi, U-3310).

TABLE 4

| Class. | Dielectric | Bandgap (eV) |
|---|---|---|
| Example 1 | $Rb_{0.025}K_{0.075}TaO_3$ | 3.6 |
| Example 2 | $Rb_{0.05}K_{0.05}TaO_3$ | 3.6 |
| Example 3 | $Rb_{0.1}K_{0.9}TaO_3$ | 3.7 |
| Example 4 | $Rb_{0.15}K_{0.85}TaO_3$ | 3.7 |
| Example 6 | $Rb_{0.05}5K_{0.05}Nb_{0.05}Ta_{0.05}O_3$ | 3.6 |
| Example 9 | $Rb_{0.2}K_{0.8}Nb_{0.2}Ta_{0.8}O_3$ | 3.7 |
| Reference Example 1 | $SrTiO_3$ | 3.2 |

As given in Table 4, the bandgap of $SrTiO_3$ of Reference Example 1 is 3.2 eV, whereas each of the dielectrics prepared in Examples 1 to 4, 6, and 9 has a band gap of about 3.6 eV or more. Thus, the dielectrics prepared in Examples 1 to 4, 6, and 9 are suitable for dielectrics of capacitors.

According to an aspect of an embodiment, a dielectric having an excellent dielectric constant and maximum dielectric constant is employed, thereby improving the capacitance of a capacitor and the performance of a semiconductor device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A dielectric comprising an oxide represented by Formula 1 below and having a cubic crystal structure:

$$(Rb_xA_{1-x})(B_yTa_{1-y})O_{3-\delta} \quad \text{<Formula 1>}$$

wherein, in Formula 1, A is at least one of K, Na, Li, and Cs,

B is at least one of Nb, and V, and $0.01 \leq x \leq 0.2$, $0 \leq y \leq 0.2$, and $0 \leq \delta \leq 0.5$ are satisfied.

2. The dielectric of claim 1, wherein, in Formula 1, x is about 0.025 to about 0.15.

3. The dielectric of claim 1, wherein, in Formula 1, y is 0 or about 0.01 to about 0.2.

4. The dielectric of claim 2, wherein, in Formula 1, y is about 0.025 to about 0.15.

5. The dielectric of claim 1, wherein the oxide is represented by Formula 2 below:

$$(Rb_xK_{1-x})(Nb_yTa_{1-y})O_{3-\delta} \quad \text{<Formula 2>}$$

wherein, in Formula 2, $0.01 \leq x \leq 0.2$, $0 \leq y \leq 0.2$, and $0 \leq \delta \leq 0.5$ are satisfied.

6. The dielectric of claim 5, wherein, in Formula 2, x is about 0.025 to about 0.15 and y is about 0.025 to about 0.15.

7. The dielectric of claim 1, wherein the oxide is represented by Formula 3 below:

$$(Rb_xK_{1-x})TaO_{3-\delta} \quad \text{<Formula 3>}$$

wherein, in Formula 3, $0.01 \leq x \leq 0.2$ and $0 \leq \delta \leq 0.5$ are satisfied.

8. The dielectric of claim 7, wherein, in Formula 3, x is about 0.025 to about 0.15.

9. The dielectric of claim 1, wherein the oxide is at least one of $Rb_xK_{1-x}TaO_3$ ($0.01 \leq x \leq 0.2$), $Rb_xLi_{1-x}TaO_3$ ($0.01 \leq x \leq 0.2$), $Rb_xNa_{1-x}TaO_3$ ($0.01 \leq x \leq 0.2$), $Rb_xCs_{1-x}TaO_3$ ($0.01 \leq x \leq 0.2$), $Rb_xK_{1-x}Nb_yTa_{1-y}O_3$ ($0.01 \leq x \leq 0.2$, y=0 or $0.01 \leq y \leq 0.2$), $Rb_xLi_{1-x}Nb_yTa_{1-y}O_3$ ($0.01 x 0.2$, y=0 or $0.01 \leq y \leq 0.2$), $Rb_xNa_{1-x}Nb_yTa_{1-y}O_3$ ($0.01 x 0.2$, y=0 or $0.01 \leq y \leq 0.2$), $Rb_xCs_{1-x}Nb_yTa_{1-y}O_3$ ($0.01 x 0.2$, y=0 or $0.01 \leq y \leq 0.2$), $Rb_xK_{1-x}V_yTa_{1-y}O_3$ ($0.01 \leq x \leq 0.2$, y=0 or $0.01 \leq y \leq 0.2$), $Rb_xLi_{1-x}V_yTa_{1-y}O_3$ ($0.01 x 0.2$, y=0 or $0.01 \leq y \leq 0.2$), $Rb_xNa_{1-x}V_yTa_{1-y}O_3$ ($0.01 \leq x \leq 0.2$, y=0 or $0.01 \leq y \leq 0.2$), and $Rb_xCs_{1-x}V_yTa_{1-y}O_3$ ($0.01 \leq x \leq 0.2$, y=0 or $0.01 \leq y \leq 0.2$).

10. The dielectric of claim 1, wherein the oxide is at least one of $(Rb_{0.15}K_{0.85})TaO_3$, $(Rb_{0.1}K_{0.9})TaO_3$, $(Rb_{0.09}K_{0.91})TaO_3$, $(Rb_{0.08}K_{0.92})TaO_3$, $(Rb_{0.07}K_{0.93})TaO_3$, $(Rb_{0.06}K_{0.94})TaO_3$, $(Rb_{0.07}K_{0.93})TaO_3$, $(Rb_{0.08}K_{0.92})TaO_3$, $(Rb_{0.09}K_{0.91})TaO_3$, $(Rb_{0.05}K_{0.95})TaO_3$, $(Rb_{0.025}K_{0.075})TaO_3$, $Rb_{0.05}K_{0.05}Nb_{0.05}Ta_{0.05}O_3$, $Rb_{0.1}K_{0.9}Nb_{0.1}Ta_{0.9}O_3$, $Rb_{0.15}K_{0.85}Nb_{0.15}Ta_{0.85}O_3$, $Rb_{0.2}K_{0.8}Nb_{0.2}Ta_{0.8}O_3$, and $Rb_{0.025}K_{0.075}Nb_{0.025}Ta_{0.075}O_3$.

11. The dielectric of claim 1, wherein the oxide has a dielectric constant of about 50 or more at 1 MHz.

12. The dielectric of claim 1, wherein the oxide has a maximum dielectric constant of about 100 or more at 1 MHz.

13. The dielectric of claim 1, wherein the oxide has a relative density of about 50% or more as measured by a buoyancy method.

14. The dielectric of claim 1, wherein the oxide has a bandgap of about 3 eV or more.

15. The dielectric of claim 1, wherein the oxide has a melting point of about 1200° C. or higher.

16. A capacitor comprising:
a first electrode;
a second electrode; and
the dielectric of claim 1 between the first electrode and the second electrode.

17. A semiconductor device comprising: the dielectric of claim 1.

* * * * *